United States Patent [19]

Stanley

[11] Patent Number: 4,802,727
[45] Date of Patent: Feb. 7, 1989

[54] POSITIONING OPTICAL COMPONENTS AND WAVEGUIDES

[75] Inventor: Ian W. Stanley, Ipswich, England

[73] Assignee: British Telecommunications public limited company, United Kingdom

[21] Appl. No.: 80,467

[22] PCT Filed: Oct. 16, 1986

[86] PCT No.: PCT/GB86/00626
§ 371 Date: Jun. 11, 1987
§ 102(e) Date: Jun. 11, 1987

[87] PCT Pub. No.: WO87/02474
PCT Pub. Date: Apr. 23, 1987

[30] Foreign Application Priority Data

Oct. 16, 1985 [GB] United Kingdom ........ 8525458
Oct. 16, 1985 [GB] United Kingdom ........ 8525459
Oct. 16, 1985 [GB] United Kingdom ........ 8525460
Oct. 16, 1985 [GB] United Kingdom ........ 8525461
Oct. 16, 1985 [GB] United Kingdom ........ 8525462
Oct. 23, 1985 [GB] United Kingdom ........ 8526189

[51] Int. Cl.[4] ............................................. G02B 6/42
[52] U.S. Cl. ............................ 350/96.20; 350/96.15; 350/96.17; 250/227
[58] Field of Search ............. 350/96.11, 96.12, 96.15, 350/96.17, 96.18, 96.19, 96.20, 96.21, 96.22; 250/227, 552; 357/17, 19, 30, 74

[56] References Cited

U.S. PATENT DOCUMENTS 4,210,923 7/1980 North et al. .............. 350/96.17 X
4,466,696 8/1984 Carney .......................... 350/96.2
4,468,084 8/1984 Hutcheson et al. ........... 350/96.11
4,756,591 7/1988 Fischer et al. ................. 350/96.20

FOREIGN PATENT DOCUMENTS 0006042 12/1979 European Pat. Off. .
0092505 10/1983 European Pat. Off. .
3307669 9/1984 Fed. Rep. of Germany ... 350/96.15

OTHER PUBLICATIONS

Garvin et al., "Ion Beam Micromachining of Integrated Optics Components," *Applied Optics*, v. 12, No. 3, Mar. 1973, pp. 455–459.
Le Noane, "Low-Loss Optical-Fibre Connection Systems," *Electronics Letters*, v. 15, No. 1, Jan. 1979, pp. 12–13.
Comerford, "Etched Silicon Structure for Aligning a Photodiode and Optical Fiber," *IBM Technical Disclosure Bulletin*, vol. 22, No. 7, Dec. 1979, pp. 2935–2936.
IBM Technical Disclosure Bulletin, vol. 23, No. 7B, Dec. 1980, IBM Corp. (New York, US) L. Balliet et al: "Self-Aligning Edge Emitter for Fiber Optics", pp. 3104–3106.
IBM Technical Disclosure Bulletin, vol. 25, No. 4, Sep. 1982, IBM Corp. (New York, US) L. Balliet et al.: "Method of Aligning Optical Fibers with LSI Chips Containing Optical Light-Emitting Sources and/or Receivers", pp. 2188–2189.

*Primary Examiner*—John D. Lee
*Attorney, Agent, or Firm*—Nixon & Vanderhye

[57] ABSTRACT

A method of positioning an optical component such as a laser diode (36) in alignment with an optical waveguide (30) comprises forming an elongate V-shaped groove (29) and a depression (31) in a substrate (28). A laser diode (3) is then mounted in the depression (31) and is accurately located therein. An optical fibre (30) is mounted in the groove (29). The relative positions of the depression (31) and the waveguide (30) are such that in use an optical beam may be coupled between the optical component and the waveguide.

12 Claims, 2 Drawing Sheets

POSITIONING OPTICAL COMPONENTS AND WAVEGUIDES

FIELD OF THE INVENTION

The invention relates to methods for positioning an optical component and at least one optical waveguide in alignment with one another.

BACKGROUND AND SUMMARY OF THE INVENTION

Recent developments in the field of optical communication have lead to the more widespread use of monomode waveguides such as monomode optical fibres. It is particularly important in this case to devise a method for accurately positioning an optical component such as a laser chip or photosensor in alignment with an optical waveguide.

In accordance with one aspect of the present invention we provide a method of positioning an optical component and at least one optical waveguide in alignment with one another, the method comprising (a) forming at least one elongate waveguide and a locating formation in a common substrate; and, (b) mounting an optical component in the locating formation, the relative positions of the locating formation and the or each waveguide being such that in use an optical beam may be coupled between the optical component and the or each waveguide.

By using such a locating groove, we have discovered that it is possible accurately to align a component with an optical waveguide since the component is located by the groove which is in the same single crystal as the waveguide. For example, a single crystal of silicon is a particularly suitable substrate for a number of reasons. These include the fact that silicon is readily available in large sizes to the most exacting standards of purity and perfection; photolithographic and etching techniques for defining surface and sub-surface geometries are highly developed; and most importantly large anisotropic etching rates exist between different crystallographic axes in the crystal. Furthermore, silicon has particularly useful electrical, mechanical and optical properties which enable the crystal to be used for opto-electronic sub-assemblies such as electro-optical modulators.

The invention also enables an optical component to be mounted in the same substrate as other optical devices.

The invention is particularly suitable for use with laser chips which have a line emission from an edge of the chip or with optical sensing chips. It has been very difficult up to now accurately to align the edge with an optical waveguide. However, these chips typically have a pair of angled supporting surfaces enabling the chip to be accurately positioned within the locating groove.

The method may further comprise causing optical radiation to be coupled between the optical component and the at least one waveguide, adjusting the position of the at least one or each waveguide, and monitoring the optical power coupled between the component and that at least one waveguide to determine the positions corresponding to maximum power coupling.

The optical component may typically be bonded in the locating groove by for example soldering.

The at least one optical waveguide may be formed by diffusing a suitable material into the substrate to change the refractive index of the substrate or by forming a substantially V-shaped groove in the substrate and mounting an optical fibre in the groove. Other methods are also possible.

Conveniently, in the former case, the locating groove is formed subsequently to the formation of an elongate optical waveguide, whereby the locating groove divides the elongate waveguide into two subsidiary waveguides. Alternatively, in the latter case the locating groove may be formed subsequently to the formation of a V-shaped fibre receiving groove, whereby the locating groove divides the V-shaped fibre receiving groove into two subsidiary V-shaped fibre receiving grooves, optical fibres being mounted in respective ones of the fibre receiving grooves.

With either of these methods, two optical waveguides are produced which are accurately aligned and, in the case where the optical component comprises a laser chip, may end adjacent opposite facets of the laser chip. This is useful for a number of reasons. Firstly, access to both facets helps to improve the spectral response of the laser chip. Secondly, a single laser chip can be used for both transmitting and receiving in optical communication systems; and thirdly monitoring of the laser chip can be carried out.

In accordance with a second aspect of the present invention, an optical assembly comprises an optical component and at least one optical waveguide which have been positioned in alignment with one another by a method in accordance with the first aspect of the invention.

In another arrangement, two optical waveguides are provided, adjacent ends of the waveguides being laterally offset, and wherein the locating groove intersects the adjacent ends of the waveguides such that the optical component positioned in the locating groove may be optically coupled with both waveguides.

BRIEF DESCRIPTION OF THE DRAWINGS

Some examples of methods and assemblies in accordance with the invention will now be described with reference to the accompanying drawings, in which.

DETAILED DESCRIPTION

Figure 1:
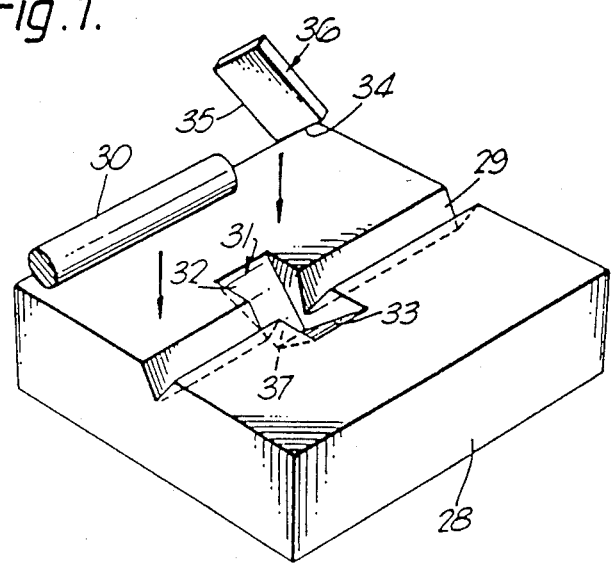
FIG. 1 is an exploded, perspective view of a first example.

The example shown in FIG. 1 comprises a single crystal silicon chip or substrate 28 having an elongate V-shaped groove 29 for receiving an optical fibre 30. A depression 31 having a triangular prismatic form is etched into the substrate through an intermediate portion of the groove 29 using an anistropic etching technique, which produces a self limited groove. The depth of the depression 31 is chosen in a conventional manner by defining the surface area of the substrate 28 which is etched. The depth is chosen such that the included angle between opposite faces 32, 33 of the depression 31 is accurately known. The detector chip 36 would need to be fabricated to produce a compatible included angle between its side walls 34, 35 and this could be achieved by using a diamond saw set at the required angle to divide up a silicon slice into separate chips. The depth is also chosen such that simply by inserting the chip 36 into the depression 31, the optical fibre 30 will be aligned with the centre of the 30 to 50 micron light sensitive area of the chip 36. As previously mentioned, the alignment between the chip 36 and the optical fibre 30 is set by the relative depths of the V-shaped groove 29 and the depression 31 which are defined by the surface window size used for the self-limiting edge.

Furthermore accurate alignment between the groove 29 and depression 31 is achieved by etching them together using different window sizes. The fact that the grooves are self limited means that the etching process does not have to be timed, as it is not possible for over etching to occur. This greatly simplifies the process in comparison with other known etching techniques which require accurate timing of the etching in order to define the required shape and size of the groove.

The chip 36 and the fibre 30 could be attached to the silicon substrate 28 by suitable metallisation and bonding. The chip 36 is typically 500 μm square and 200 μm thick.

Figure 2:
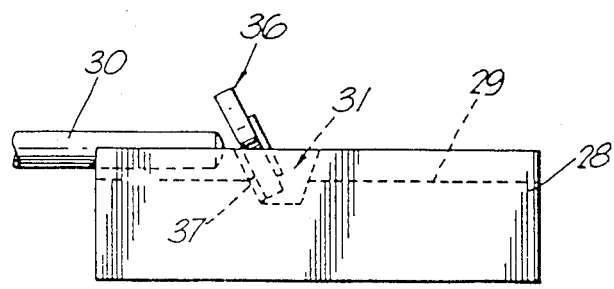
FIG. 2 is a side elevation of the example shown in FIG. 1.

FIG. 2 illustrates the use of the angled end surface 37 of the depression 31 as the combined bonding and lower contacting surface. Any optical penalty caused by the angled detector surface will be minimised by the use of an anti-reflection coating on the chip 36 and the lens ended fibre 30.

Figure 3:
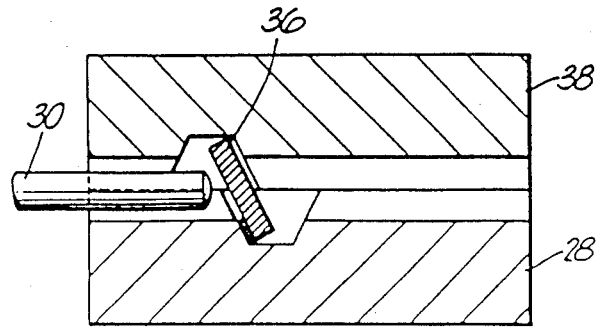
FIGS. 3 and 4 are side elevations similar to FIG. 2 but of modifications of the first example.

If required, a mirror image substrate 38 defining a clamp could be mounted on the substrate 28 as shown in FIG. 3. The grooves 29 in each substrate 28, 38 could be used to provide a route for the second electrical connection to an outside circuit but other configurations including metal tracks on the surface of one or both of the substrates 28, 38 are possible.

Figure 4:
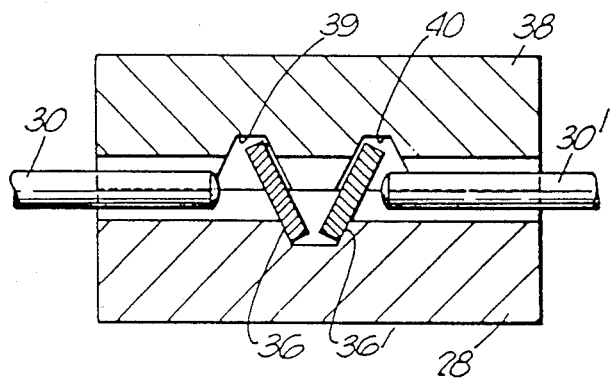

An extension of the principle shown in FIG. 3 would allow a balanced photodiode configuration to be considered with the fibres in-line as shown in FIG. 4, using a parallel arrangement of grooves and fibres. In FIG. 4 a second detector 36' is bonded to the face of the depression 31 opposite to the face 37 and each detector 36, 36' is received in complementary depressions 39, 40 in the upper substrate 38. In addition a second optical fibre 30' extends between the substrate 28, 38 to the detector 36'.

For optical receivers where the first stage amplifier is a bipolar silicon transistor or FET the associated circuits could be diffused into the silicon chip 28 adjacent to the photodiode 36.

Figure 6:
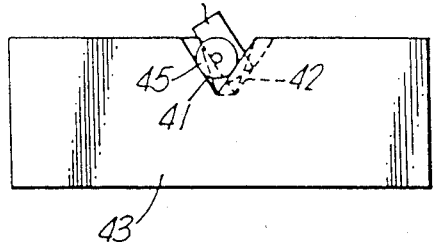
FIG. 6 is a view taken in the direction A in FIG. 5.
Figure 5:
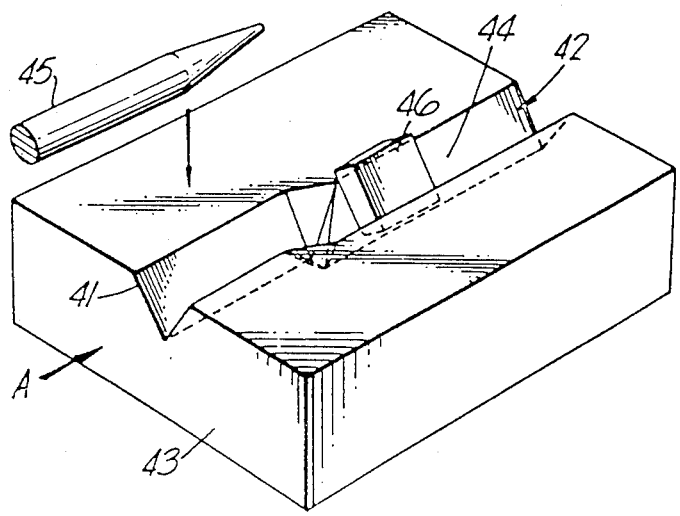
FIG. 5 is a perspective view of a second example.

In contrast to the light sensitive area of a photodiode, the light emission from a laser diode is from a region situated on two opposite sides of the chip and is situated about 1.5 microns from one of the faces. One of the main requirements in the mounting of a laser diode is that the centre line of the light emitting region is aligned with the axis of the adjacent optical fibre. FIGS. 5 and 6 illustrate a further assembly for achieving this mounting configuration. In this example, two V-shaped grooves 41, 42 are etched in a silicon substrate 43, the two grooves being parallel but offset from one another. A laser diode chip 46 is bonded to a sloping side 44 of the groove 42 while an optical fibre 45 is positioned in the groove 41. As before, the depths of the grooves 41, 42 are defined by a horizontal masking process and additionally the fibre diameter and concentricity is accurately defined. Thus, the alignment accuracy is dictated by the width of the chip 46. The lens ended optical fibre 45 is tapered to allow an efficient fibre to laser distance to be obtained.

I claim:

1. A method of positioning an optical component and at least one optical waveguide in alignment with one another, said optical component having at least two supporting surfaces the method comprising the steps of:
   (a) forming at least one elongate waveguide and a locating groove in a common single crystal substrate, the step of forming the locating groove including anisotropically etching the substrate to form a self-limited V-shaped groove, the included angle of the locating groove being substantially equal to the angle between the supporting surfaces of the optical component; and
   (b) mounting the optical component in the locating groove;
   the relative positions of the locating groove and the or each waveguide being such that in use an optical beam may be coupled between the optical component and the or each waveguide.

2. A method according to claim 1, wherein the at least one waveguide is formed by diffusing a suitable material into the substrate.

3. A method according to claim 2, wherein the locating groove is formed subsequently to the formation of an elongate optical waveguide, whereby the locating formation divides the elongate waveguide into two subsidiary waveguides.

4. A method according to claim 1, wherein the at least one waveguide is formed by forming a substantially V-shaped fibre receiving groove in the substrate and mounting an optical fibre in the fibre receiving groove.

5. A method according to claim 4 wherein the locating groove is formed subsequently to the formation of the V-shaped fibre receiving groove whereby the locating groove divides the V-shaped fibre receiving groove into two subsidiary V-shaped fibre receiving grooves, optical fibres being mounted in respective ones of the fibre receiving grooves.

6. An optical assembly comprising an optical component having at least two supporting surfaces and at least one optical waveguide which have been positioned in alignment with one another by the method of:
   (a) forming at least one elongate waveguide and a locating groove in a common single crystal substrate, the step of forming the locating groove including anisotropically etching the substrate to form a self-limited V-shaped groove, the included angle of the locating groove being substantially equal to the angle between the supporting surfaces of the optical component; and
   (b) mounting the optical component in the locating groove;
   the relative positions of the locating groove and the or each waveguide being such that in use an optical beam may be coupled between the optical component and the or each waveguide.

7. An assembly according to claim 6, wherein the optical component comprises a laser chip.

8. An assembly according to claim 6 wherein the optical component is bonded to a surface of the locating groove.

9. An assembly according to claim 6, wherein two optical waveguides are provided, adjacent ends of the waveguides being laterally offset, and wherein the locating groove intersects the adjacent end of the waveguides such that the optical component positioned in the groove may be optically coupled with both waveguides.

10. An optical assembly according to claim 6 wherein the locating groove provides for a transverse offset with respect to the optical waveguide axis.

11. An optical assembly according to claim 6 wherein the locating groove provides for an offset with respect to the waveguide axis.

12. An assembly according to claim 6 wherein the optical component comprises an optical sensing chip.

* * * * *